United States Patent
Morandi et al.

(10) Patent No.: US 11,849,590 B2
(45) Date of Patent: Dec. 19, 2023

(54) CAPACITOR COMPRISING A BISMUTH METAL OXIDE-BASED LEAD TITANATE THIN FILM

(71) Applicant: TEXAS INSTRUMENTS INCORPORATED, Dallas, TX (US)

(72) Inventors: Carl Sebastian Morandi, State College, PA (US); Susan Trolier-McKinstry, State College, PA (US); Kezhakkedath Ramunni Udayakumar, Dallas, TX (US); John Anthony Rodriguez, Dallas, TX (US); Bhaskar Srinivasan, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/479,542

(22) Filed: Sep. 20, 2021

(65) Prior Publication Data

US 2022/0005814 A1   Jan. 6, 2022

Related U.S. Application Data

(62) Division of application No. 15/893,323, filed on Feb. 9, 2018, now Pat. No. 11,158,642.

(60) Provisional application No. 62/456,878, filed on Feb. 9, 2017.

(51) Int. Cl.
H01L 27/11507 (2017.01)
H10B 53/30 (2023.01)
H01L 49/02 (2006.01)

(52) U.S. Cl.
CPC ............ *H10B 53/30* (2023.02); *H01L 28/55* (2013.01); *H01L 28/56* (2013.01); *H01L 28/57* (2013.01)

(58) Field of Classification Search
None
See application file for complete search history.

(56) References Cited

U.S. PATENT DOCUMENTS

| | | |
|---|---|---|
| 6,184,550 B1 | 2/2001 | Van Buskirk et al. |
| 2001/0054733 A1 | 12/2001 | Agarwal et al. |
| 2003/0020157 A1 | 1/2003 | Natori et al. |
| 2004/0111849 A1 | 6/2004 | Omori et al. |
| 2004/0266029 A1 | 12/2004 | Jang et al. |
| 2006/0027847 A1 | 2/2006 | Koo et al. |
| 2007/0045689 A1 | 3/2007 | Lim et al. |
| 2010/0187584 A1 | 7/2010 | Matsuda |
| 2015/0084486 A1 | 3/2015 | Eguchi |

OTHER PUBLICATIONS

Morandi, et al. "xBi( Mg1/2 Ti 1/2)O3—( 1-x) Pb TiO3:Developing Processing-Microstructure Property Relationships", Presented at IEEE International Symposium on Application of Ferroelectric (ISAF), May 7-11, 2017 Atlanta, GA.

(Continued)

*Primary Examiner* — Joseph C. Nicely
*Assistant Examiner* — Lamont B Koo
(74) *Attorney, Agent, or Firm* — Andrew R. Ralston; Frank D. Cimino

(57) ABSTRACT

In some examples, a system comprises a capacitor including a first plate, a second plate, and a ferroelectric material disposed between the first and the second plates and comprising a Bismuth Metal Oxide-Based Lead Titanate thin film. The capacitor further comprises a dielectric layer disposed on a transistor, wherein the capacitor is disposed on the dielectric layer.

17 Claims, 4 Drawing Sheets

(56) References Cited

OTHER PUBLICATIONS

Morandi et al. "Pulsed Laser Deposited 35 Bi(Mg 1/2Ti1/2)03—65 PbTiO3 Thin Films Part I—Influence of Processing on Composition, Microstructure and Ferroelectric Hysteresis" The Pennsylvania State University, University Park, PA 168002, USA, 2018.

Morandi et al. Pulsed Laser Deposited 35 Bi(Mg1/2Ti1/2)03—65 PbTi03 Thin Films, Part 1: Influence of Processing on Composition, Microstructure and Ferroelectric Hysteresis, The Pennsylvania State University, University Park, PA 16802, USA, 2018.

Morandi et al. 35 Bi(Mg1/2Ti1/2)03—65 PbTiO3 Thin Films Deposited by Pulsed Laser Deposition Part 2—Influence of A-site Deficiency and Thickness Scaling on Electric Properties, The Pennsylvania State University, University Park, PA 16802, 2018.

Morandi et al. "Pulsed Laser Deposited 35 Bi(Mg1/2Tii1/2)03—65 PbTi03 Thin Films Part 2—A Site Deficiency and Thickness Scaling Influence on Electrical Properties" The Pennsylvania State University, University Park, PA 16802, 2018.

CAPACITOR COMPRISING A BISMUTH METAL OXIDE-BASED LEAD TITANATE THIN FILM

CROSS-REFERENCE TO RELATED APPLICATIONS

Under 35 U.S.C. § 120, this divisional application claims the benefit of and priority to U.S. patent application Ser. No. 15/893,323, filed Feb. 9, 2018 (Texas Instruments docket number TI-78166), the entirety of which is hereby incorporated herein by reference. The present application claims priority to U.S. Provisional Patent Application No. 62/456,878, which was filed Feb. 9, 2017, is titled "High Temperature Materials for Ferroelectric Random Access Memory (FRAM) Applications," and is incorporated herein by reference in its entirety.

BACKGROUND

Ferroelectric materials are widely used to make capacitors. Generally, a ferroelectric capacitor includes a ferroelectric material disposed between a top electrode and a bottom electrode. The spontaneous polarization of ferroelectric materials results in a polarization-electric field (P-E) hysteresis effect, which can, in certain applications, be used to perform a memory function. For example, the voltage V applied across the top and bottom electrodes generates an electric field (E), which aligns the dipoles of the ferroelectric material in the direction of the electric field. This may occur due to a small shift in the positions of atoms in their crystal structure. Following the removal of the voltage V, the dipoles in the ferroelectric material retain their polarization state and binary 1's and 0's can be stored as different orientations of the dipoles.

SUMMARY

In accordance with at least one example, a system comprises a capacitor including a first plate, a second plate, and a ferroelectric material disposed between the first and the second plates and comprising a Bismuth Metal Oxide-Based Lead Titanate thin film. The capacitor further comprises a dielectric layer disposed on a transistor, wherein the capacitor is disposed on the dielectric layer.

In accordance with another example, a method comprises obtaining a substrate; fabricating a transistor comprising a drain region, a source region, and a gate layer, the drain region and the source region disposed in the substrate, the gate layer disposed on the substrate; depositing a dielectric layer and a conductor structure on the substrate; and forming at least one ferroelectric capacitor on the dielectric layer, the ferroelectric capacitor comprising a Bismuth Metal Oxide-Based Lead Zirconate Titanate thin film.

In accordance with yet another example, a capacitor comprises a first plate, a second plate, and a ferroelectric material disposed between the first and the second plates, wherein the ferroelectric material comprises $xBi(Mg_{0.5}Ti_{0.5})O_3$-$(1-x)Pb(Zr_y Ti_{1-y})O_3$.

BRIEF DESCRIPTION OF THE DRAWINGS

For a detailed description of various examples, reference will now be made to the accompanying drawings in which.

DETAILED DESCRIPTION

Figure 1A:
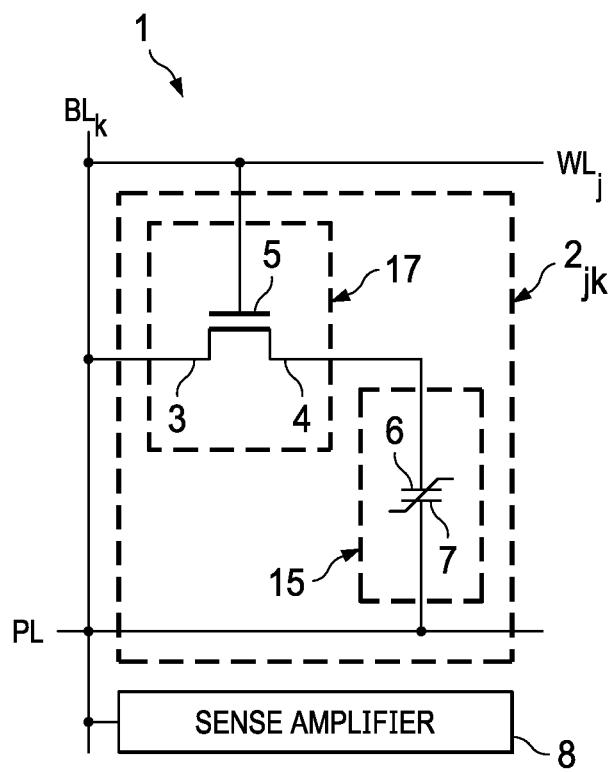
FIG. 1(a) depicts a circuit of an illustrative ferroelectric random access memory (FRAM) cell, in accordance with various examples.

A ferroelectric random access memory (FRAM or FeRAM) is a non-volatile solid-state memory technology that includes capacitors in which the dielectric material is a ferroelectric material. As described above, storing a 1 or 0 in the FRAM requires polarizing the dipoles in the ferroelectric material in a specific direction using an electric field. Following the removal of the electric field (or the applied voltage), the dipoles in the ferroelectric material must retain their polarization state (for a stated temperature and a specified time) unless an electric field in the opposite direction is applied to erase/re-write the stored information. Therefore, to meet the desired specification for a non-volatile memory, one of the primary functions of a ferroelectric material is to retain the stored information (or, in other words, the direction of the dipoles) following removal of the applied electric field.

Typically, the retention specification for non-volatile memory depends on the type of ferroelectric material being used. For instance, a FRAM using lead zirconate titanate $Pb[Zr_x Ti_{1-x}]O_3$ ($0 \leq x \leq 1$) (PZT) as the ferroelectric material retains its data (i.e., the direction of the dipoles) for ten years at 85 degrees Celsius (C). For typical applications such as memory applications in a smartphone, data retention for ten years at 85 C may be considered robust and reliable. However, for high-temperature applications (e.g., applications that include the ambient temperatures above 125 C), the data retention ability of PZT degrades.

Accordingly, the integrity of the information stored in a FRAM is a function of the degree of polarization that the FRAM is capable of maintaining and the length of time for which the FRAM is capable of maintaining that polarization. When exposed to high temperatures, a FRAM is more susceptible to losing its ability to stay polarized and is unable to store information as long as the high-temperature condition exists. This happens because the spontaneous polarization of the ferroelectric material (such as PZT) reduces as the ambient temperature of the FRAM shifts towards the Curie (or transition) temperature of the ferroelectric material. For instance, the Curie temperature of PZT at its morphotropic phase boundary (MPB) is approximately 380 C and a FRAM including PZT is operated below 125 C to prevent data loss. The morphotropic phase boundary may be defined as the nearly-temperature-independent boundary in a composition diagram between two different ferroelectric phases. The specification temperature of a PZT-based FRAM is a function of its corresponding Curie temperature.

Therefore, a new ferroelectric material is desired for high-temperature memory applications. Specifically, new ferroelectric materials are desired with the Curie temperature higher than PZT Curie temperature. The inventors discovered that Bismuth Metal Oxide-based-Lead Zirconate Titanate ($BiREO_3$-PZT) thin films have a high Curie temperature, where RE denotes one or more cations that produce a net oxidation state of approximately 3. As described further below, the inventors also noted that Bismuth Metal Oxide-based-Lead Titanate (BiREO$_3$-PT) thin films have a high Curie temperature (approximately 440 C), low leakage at high temperatures (e.g., up to 200 C), high remanent polarization at high temperature (e.g., up to 32 uC/cm$^2$), and low coercive field that enables low switching voltages. Such properties make Bismuth Metal Oxide-based-Lead Zirconate Titanate (BiREO$_3$-PZT) and Bismuth Metal Oxide-based-Lead Titanate (BiREO$_3$-PT) thin films a good candidate to replace PZT for high-temperature applications.

Accordingly, at least some of the examples disclosed herein are directed towards FRAM memory devices that utilize ferroelectric materials including Bismuth Metal Oxide-based-Lead Zirconate Titanate (BiREO$_3$-PZT) thin films. In some examples, Bismuth Magnesium Titanate-Lead Zirconate Titanate (xBi(Mg$_{0.5}$Ti$_{0.5}$)O$_3$-(1-x) Pb(Zr$_y$,Ti$_{1-y}$)O$_3$ [BMT-PZT]) (where x and y are the concentrations) thin films are employed. In some examples, thin films with the chemical composition of 35Bi(Mg$_{1/2}$Ti$_{1/2}$)O$_3$-65PbTiO$_3$ [35BMT-65PT] may be used. In this example, two different metals (magnesium and titanium) are employed, and the concentration of zirconium is kept 0. As further described below, other elements may be combined to form other Bismuth Metal Oxide-based-Lead Zirconate Titanate (BiREO$_3$-PZT) ferroelectric thin films that have higher Curie temperatures than that of PZT. At least some of the examples disclosed herein are directed towards the fabrication of a FRAM memory device, which may be employed in high temperature applications.

Referring now to FIG. 1(a), an illustrative circuit of a 1T-1C (one transistor, one capacitor) FRAM memory device 1 is shown, which employs Bismuth Metal Oxide-based-Lead Zirconate Titanate (BiREO$_3$-PZT) thin films, specifically, 35Bi(Mg$_{1/2}$Ti$_{1/2}$)O$_3$-65PbTiO$_3$ (35BMT-65PT). As noted above, the use of 35BMT-65PT is not limiting, but for the sake of simplicity, the examples disclosed herein describe the use of 35BMT-65PT thin films. However, other BiREO$_3$-PZT thin films, including at least one or more of the following elements may be used: Strontium (Sr), Calcium (Ca), Copper (Cu), Manganese (Mn), Gallium (Ga), Cobalt (Co), Scandium (Sc), Indium (In), Niobium (Nb), Zinc (Zn), Tantalum (Ta), Ytterbium (Yb). Additionally, this disclosure is not limited to 1T-1C FRAM memory devices. Various other architectures, including 2T-2C (two transistors, two capacitors) cell architectures, may employ the above-referenced ferroelectric thin films.

The FRAM memory device 1 includes a cell 2$_{jk}$, which represents a single cell residing in a row j and a column k of an array of similar cells. The cell 2$_{jk}$ includes a transistor 17 with a first terminal 3, a second terminal 4, and a gate terminal 5. Assuming the gate signal at the terminal 5 is higher than the threshold voltage of the transistor 17, current flows through the transistor 17, i.e., the transistor 17 is ON. The direction in which the current flows through the transistor 17 depends on the relative potential of the first and the second terminals 3, 4, respectively. For instance, if the potential at the terminal 3 is higher than the potential at the terminal 4, the direction of the current flow will be from the first terminal 3 to the second terminal 4. On the other hand, if the potential at the terminal 3 is lower than the potential at the terminal 4, the direction of the current flow will be from the second terminal 4 to the first terminal 3. In some examples, the transistor 17 is an n-channel transistor. In other examples, the transistor 17 is a p-channel transistor.

The cell 2$_{jk}$ also includes a ferroelectric capacitor 15, which includes a first plate 6 and a second plate 7. The ferroelectric capacitor 15 may include 35Bi(Mg$_{1/2}$Ti$_{1/2}$)O$_3$-65PbTiO$_3$ (35BMT-65PT) thin film.

The first terminal 3 may couple to bit line BL$_k$ extending along the column k. The gate terminal 5 may couple to the word line WL$_j$ extending along the row j. The first plate 6 may couple to the second terminal 4, and the second plate 7 may couple to the plate line PL that may be common for all cells 2 in the array (or in a particular portion of the array, depending on the architecture). In some examples, the sense amplifier 8 may couple to the bit line BL$_k$ and operates to amplify and compare the bit line voltage developed by the current (e.g., reading current) received from the transistor 17.

Writing "1" or "0" to a cell 2$_{jk}$ may require the application of the voltage+Vcc or −Vcc to first and second plates 6, 7 of the ferroelectric capacitor 15. Writing data may be performed by first selecting the word line WL$_j$ (meaning that the transistor 17 is on) and applying a voltage (Vcc) between the bit line (BL$_k$) and the plate line (PL). In some examples, application of this voltage to the ferroelectric capacitor 15 causes the dipoles in the ferroelectric thin film to turn a certain direction and data is written. In some examples, writing "0" may be accomplished by making BL$_k$=0 V and PL=Vcc, whereas "1" may be written by making BL$_k$=Vcc and PL=0 V. After writing, the data may be retained even if the selected word line becomes unselected (meaning that the transistor is turned off). As noted above, the retention of such data is observed at high temperature applications (e.g., with ambient temperatures, in some examples, above 85 C; in some examples, above 100 C; in some examples, above 150 C; in some examples, up to 225 C; in some examples, above 225 C) when ferroelectric thin film, such as, 35BMT-65PT is employed in the ferroelectric capacitor 15. The sense amplifier 8 may be used, at least in part, to read the stored information in the cell 2$_{jk}$.

Figure 1B:
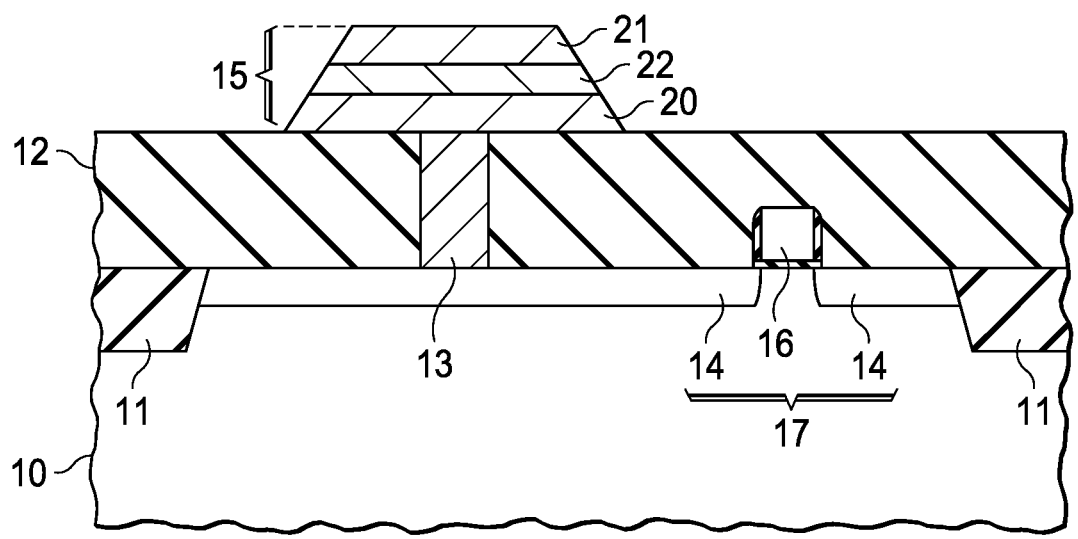
FIG. 1(b) depicts a cross-sectional view of a portion of an illustrative FRAM cell at a selected stage of manufacture, in accordance with various examples.

FIG. 1(b) depicts an illustrative cross-sectional view of a portion of the cell 2$_{jk}$ at a selected stage of manufacture. Specifically, FIG. 1(b) depicts a substrate 10 that includes isolation dielectric structures 11, which form an active region between them. The transistor 17 is disposed in the active region. Assuming that the transistor 17 is an n-channel transistor, the transistor 17 includes n-type source/drain regions 14 interfacing the surface of the p-type substrate 10. The transistor 17 also includes a gate electrode 16 that is overlaid between the source/drain regions 14, as shown. FIG. 1(b) also depicts an inter-level dielectric layer 12 that is disposed over the transistor 17, with a conductive structure 13 (e.g., a metal structure) disposed in a contact opening through the inter-level dielectric layer 12. The conductive structure 13 may provide a conductive connection between one of the source/drain regions 14 of the transistor 17 and the ferroelectric capacitor 15 (e.g., between the first plate 20 and source/drain region 14).

In the example of FIG. 1(b), the ferroelectric capacitor 15 is formed of a ferroelectric stack of first and second plates 20, 21, respectively, between which a ferroelectric material 22, such as 35BMT-65PT, is disposed. In some examples, the first plate 20 is formed at a position overlaying the conductive structure 13. In some examples, the first plate 20 and the second plate 21 are formed from one or more layers of conductive metals, metal oxides, and the like. The first and second plates 20, 21 may include noble metal (e.g., Ru, Pt, Ir, Rh, Pd, Au) or metal oxide (e.g., LNO, LSCO, RuO$_x$, IrO$_x$, PdO$_x$, SrRuO$_3$). In other examples, the first plate 20 may include a stack of layers 24, 25 (depicted in FIG. 2(a)). The layer 24, in some examples, may be a diffusion barrier layer (e.g., titanium) that may be in contact with conductive structure 13. The layer 25, in such an example, may include noble metal (e.g., Ru, Pt, Ir, Rh, Pd, Au) or metal oxide (e.g., LNO, LSCO, $RuO_x$, $IrO_x$, $PdO_x$, $SrRuO_3$) overlying the layer 24 and in contact with the ferroelectric material 22. The first and second plates 20, 21 are typically formed of the same conductive material or materials as one another, for purposes of symmetry or simplicity of the manufacturing flow. In other examples, a layer 23 (FIG. 2(b)) may be disposed between the ferroelectric material 22 and the first plate 20. The layer 23 may be a seed layer, which, in some examples, prevents charge injection and leakage from the ferroelectric material 22 and improves the polarization of the ferroelectric material 22. In some examples, the layer 23 may include lead titanate ($PbTiO_3$). In other examples, the layer 23 includes lanthanum doped-lead titanate ($PbTiO_3$). In some examples, the layer 23 may be grown via a chemical solution deposition process.

Figure 3:
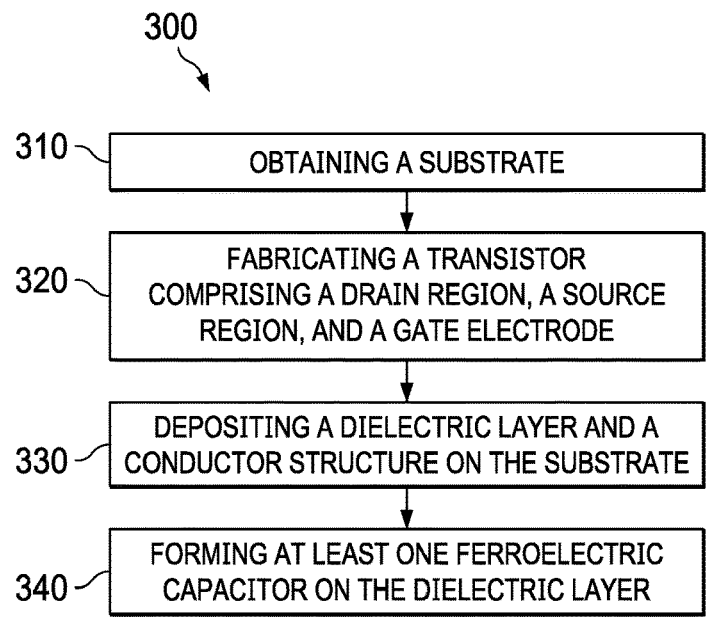
FIG. 3 depicts an illustrative method for fabricating a FRAM cell, in accordance with various examples.
Figure 4A:
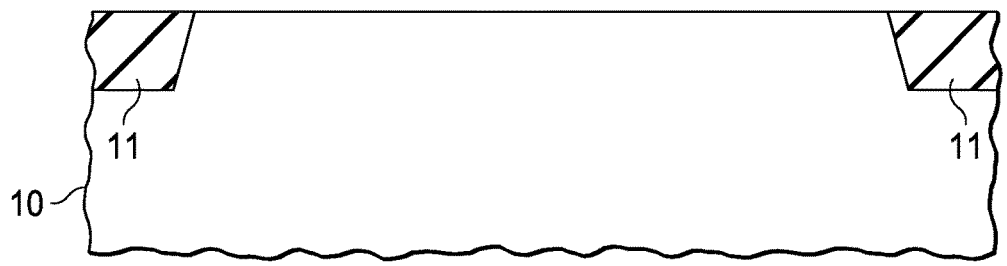
FIG. 4(a)-FIG. 4(d) depict an illustrative flow diagram of the fabrication of a FRAM cell, in accordance with various examples.

FIG. 3 depicts an illustrative method 300 to fabricate a memory cell, such as the cell $2_{jk}$ of FIG. 1(b). The method 300 is herein described in tandem with FIG. 4(a)-FIG. 4(d). The method 300 begins with obtaining a substrate 10 (step 310, FIG. 4(a)). The substrate 10, in some examples, is doped with p-type dopants and includes isolation structures, such as isolation structures 11, which define an active region between them. The method 300 then includes fabricating a transistor 17 (step 320, FIG. 4(b)), which is fabricated in the above-mentioned active region. As part of step 320, the transistor 17 of FIG. 1(b) may be fabricated using any suitable process, e.g., by deposition and photolithographic patterning and etch of polysilicon material to define gate electrode 16 overlying a gate dielectric, with n-type source/drain regions 14 formed on either side of gate electrode 16 by ion implantation and subsequent activation anneal.

Figure 4B:
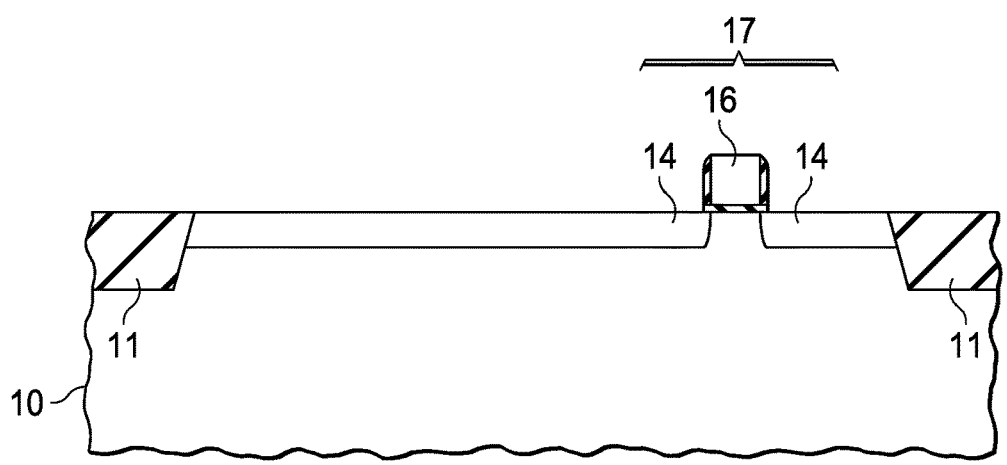
Figure 4C:
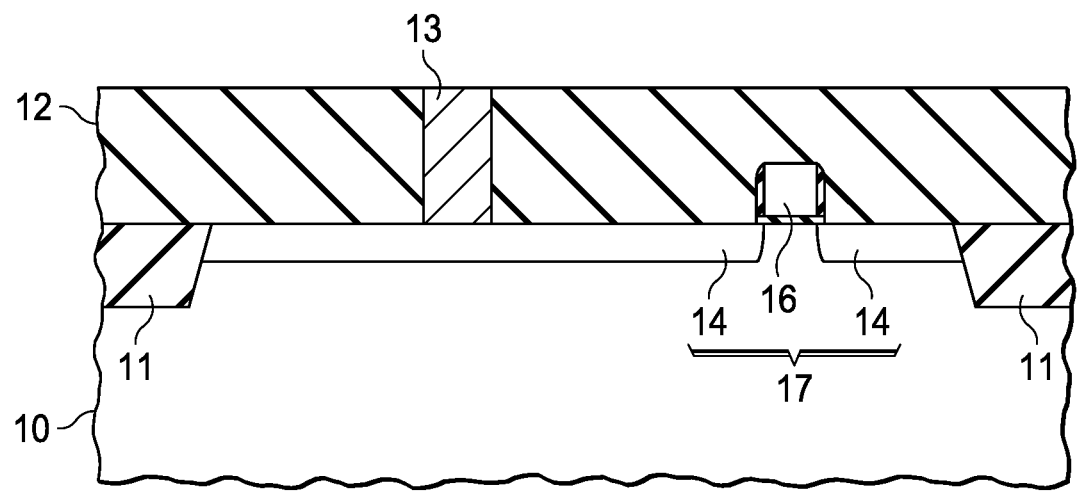
Figure 4D:
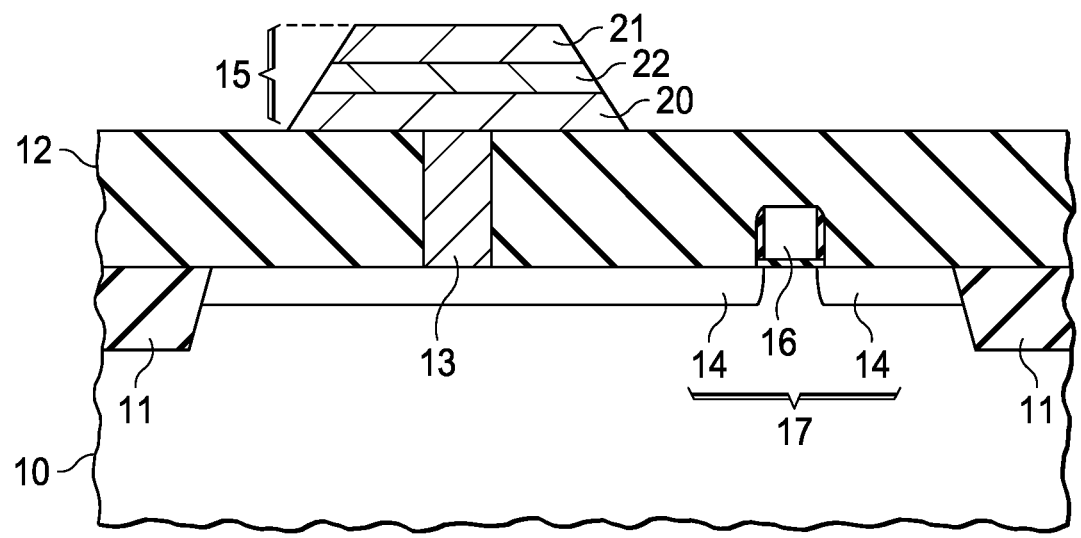

The method 300 then includes depositing a dielectric layer 12 and a conductor structure 13 on the substrate 10 (step 330, FIG. 4(c)). The dielectric layer 12 may be deposited using a chemical vapor deposition technique, followed by planarization (if desired). As part of step 330, the contact opening (e.g., vias) are etched through the first dielectric layer 12 at a selected location, and the conductor structure 13 is formed by depositing a metal in that opening. The conductor structure 13, in some examples, is formed to provide contact to the source/drain regions 14 of the transistor 17.

Figure 2A:
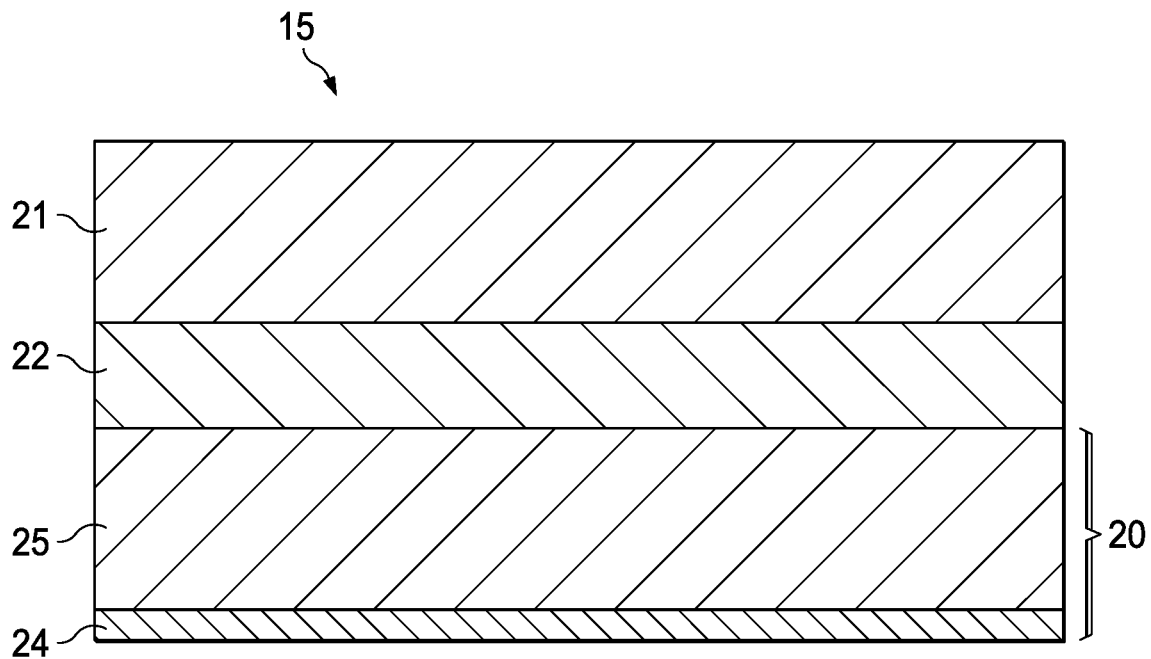
FIG. 2(a) and FIG. 2(b) depict examples of an illustrative ferroelectric capacitor, in accordance with various examples.
Figure 2B:
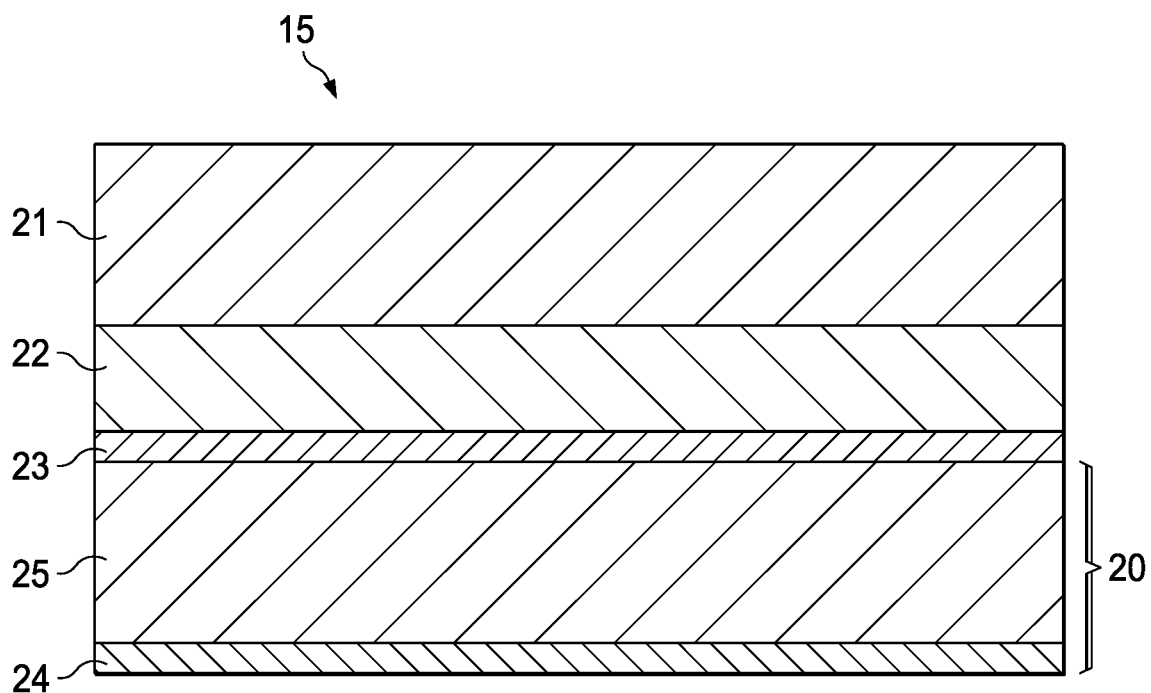

The method 300, following the fabrication of the dielectric layer 12 and the conductor structure 13, may move to step 340, which includes forming at least one ferroelectric capacitor 15 on the dielectric layer 12 (FIG. 4(b)). The step 340 may include fabricating one or more conductive plates (e.g., the first plate 20) over the dielectric layer 12 and conductive structure 13, to serve as the first plate 20 for capacitor 15. The plate 20 may be fabricated, e.g., using a physical vapor deposition (PVD) technique. The PVD technique may include forming one or more layers of conductive material in succession (e.g., layers 24, 25 as depicted in FIG. 2(a)) using sputter deposition or another suitable PVD technique.

As a part of step 340, following the first plate 20 deposition, the ferroelectric material 22, such as 35BMT-65PT, is deposited on the first plate 20. Several different processes, e.g., metal organic chemical vapor deposition (MOCVD), physical vapor deposition, pulsed laser deposition, etc. can be used to deposit the ferroelectric material 22. One such process is now described.

In some examples, pulsed laser deposition (PLD) may be used to deposit the ferroelectric material 22, such as 35BMT-65PT thin film. The deposition of such a ferroelectric material may be performed by pumping down the PLD chamber to $\approx 10^{-6}$-$10^{-7}$ Torr. Following pumping down the chamber, a 90%/10% $O_2/O_3$ mixed gas may be employed to produce a chamber pressure of 60-400 mTorr. The oxygen/ozone mixed gas provides the background atmosphere during deposition. In some examples, a krypton fluoride (KrF) excimer laser with an energy density of $\approx 1.6 \pm 0.1$ J/cm$^2$ may be used. The target-to-substrate distance may be maintained at 6 cm, and the substrate temperature may be maintained at 700° C. In some examples, the substrate (in this example, the substrate 10, including the first plate 20) is bonded to the heater block using silver paste to insure good thermal contact. In some examples, prior to the ferroelectric material 22 deposition, a seed layer (layer 23, FIG. 2(a)) may be deposited onto the first plate 20. In some examples, the seed layer may include lead titanate ($PbTiO_3$). In other examples, the seed layer includes lanthanum doped-lead titanate (Pb-$TiO_3$). Seed layers (10 to 40 nm) may aid in lowering the dc conductivity by an order of magnitude and reduce charge injection/leakage from the ferroelectric thin film (for example: at 100 kV/cm, the leakage is approximately 10-E-6 A/cm$^2$ if a seed layer is disposed between the ferroelectric thin film and a capacitor plate).

Following achieving a target temperature of about 600-700 C, the laser is incident at a target layer comprising 35BMT-65PT. The target absorbs the incident laser, ablates, and creates dynamic plasma, which is further deposited on the first plate 20 or on the seed layer in examples in which a seed layer is used. In some examples, the stoichiometry of the resulting ferroelectric thin film may not be what is desired (i.e., 35BMT-65PT). In such examples, certain elements, such as Lead (Pb), Bismuth (Bi), and Magnesium (Mg), are added in excess to the target material (i.e., the target concentration is non-stoichiometric) to achieve the desired stoichiometry of the ferroelectric thin film, i.e., 35BMT-65PT. In some examples, Lead may be added 48% in excess, Bismuth is added 20% in excess, and Magnesium is added 10% in excess. The above-description was for Bismuth Magnesium Titanate-Lead Zirconate Titanate x $Bi(Mg_{0.5}Ti_{0.5})O_3$-(1-x) $Pb(Zr_y)O_3$ (BMT-PZT), specifically for 35BMT-65PT. However, other Bismuth Metal Oxide-Based Lead Zirconate Titanate thin films, including at least one or more of the following elements may be used: Strontium (Sr), Calcium (Ca), Copper (Cu), Manganese (Mn), Gallium (Ga), Cobalt (Co), Scandium (Sc), Indium (In), Niobium (Nb), Zinc (Zn), Tantalum (Ta), Ytterbium (Yb). The PLD process described in FIG. 3 may be adapted to deposit thin film layers other than 35BMT-65PT. For example, the pressure, temperature, target material, and time values may be adapted to deposit thin layers of desired chemical composition.

BMT-PT thin films maintain its ferroelectric characteristic over a range of target compositions (excess Pb extending from 20% to 85%; Bi from 10% to 20%; Mg from 5% to 10%). Over the range of deposition pressure (60-400 mTorr), and within the range of target composition and temperature discussed above, BMT-PT thin films are phase pure perovskite (even for sub-stoichiometric Pb), indicating robustness of the BMT-PT solid solution (thin film) system. For film thickness between 85 nm to approximately 600 nm, Curie temperature is $\approx 430°$ C. and dissipation losses are less than 15% at 1 MHz up to 585° C. BMT-PT thin films have a maximum remanent polarization of up to 32 μC/cm$^2$ with little or no thickness dependence of the remanent polarization from 100 to 700 nm and the coercive voltages are in the range of 75-100 kV/cm. In some examples involving unseeded (e.g., where the seed layer is absent) BMT-PT films, deposition under O₂/Ar gas mix affects leakage and ferroelectric properties, with optimal leakage at 50% O₂/50% Ar. In some examples, the laser frequency of the laser used in the PLD process may be a factor that affects film crystallinity.

In the foregoing discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method comprising:
    fabricating a transistor in or over a semiconductor substrate, the transistor including a drain region, a source region, and a gate electrode;
    forming a dielectric layer over the transistor and a vertical conductor structure through the dielectric layer that conductively connects to one of the source region and the drain region; and
    forming a ferroelectric capacitor over the dielectric layer and conductively connected to the vertical conductor structure, the ferroelectric capacitor comprising a Bismuth Metal Oxide-Based Lead Zirconate Titanate thin film comprising Bismuth Magnesium Titanate-Lead Zirconate Titanate $xBi(Mg_{0.5}Ti_{0.5})O_3$-$(1-x)Pb(Zr_yTi_{1-y})O_3$ with x and y concentrations of $0<x<1$ and $0<y<1$.

2. The method of claim 1, wherein the Bismuth Metal Oxide-Based Lead Zirconate Titanate thin film comprises 35% $Bi(Mg_{0.5}Ti_{0.5})O_3$ and 65% $PbTiO_3$ (35BMT-65PT).

3. The method of claim 1, wherein the Bismuth-Based Lead Zirconate Titanate thin film includes Scandium (Sc).

4. The method of claim 1, wherein the Bismuth Metal Oxide-Based Lead Zirconate Titanate thin film includes Indium (In).

5. The method of claim 1, wherein the Bismuth Metal Oxide-Based Lead Zirconate Titanate thin film includes Ytterbium (Yb).

6. A method of forming a system comprising:
    forming a capacitor over a semiconductor substrate, the capacitor including a first plate, a second plate, and a ferroelectric material disposed between the first and the second plates, the ferroelectric material comprising a Bismuth Metal Oxide-Based Lead Titanate thin film; and
    forming a transistor between a dielectric layer and the semiconductor substrate, wherein the capacitor is disposed on the dielectric layer;
    wherein the Bismuth Metal Oxide-Based Lead Titanate thin film comprises 35% $Bi(Mg_{0.5}Ti_{0.5})O_3$ and 65% $PbTiO_3$ [35BMT-65PT].

7. The method of claim 6, wherein the Bismuth Metal Oxide-Based Lead Titanate thin film includes Scandium (Sc).

8. The method of claim 6, wherein the Bismuth Metal Oxide-Based Lead Titanate thin film includes Indium (In).

9. The method of claim 6, wherein the Bismuth Metal Oxide-Based Lead Titanate thin film includes Ytterbium (Yb).

10. The method of claim 6, wherein the first and the second plates are selected from the group consisting of Ru, Pt, Ir, Rh, Pd, Au, $RuO_x$, $IrO_x$, $PdO_x$, LNO, LSCO, and $SrRuO_3$.

11. The method of claim 6, wherein the capacitor further comprises a seed layer positioned between the ferroelectric material and the first plate.

12. The method of claim 11, wherein the seed layer includes Lead-Titanate ($PbTiO_3$).

13. The method of claim 6, wherein the Bismuth Metal Oxide-Based Lead Titanate thin film comprises 35% $Bi(Mg_{0.5}Ti_{0.5})O_3$ and 65% $PbTiO_3$ [35BMT-65PT].

14. A method, comprising:
    forming a first plate and a second plate of a capacitor, and disposing a ferroelectric material between the first and the second plates, wherein the ferroelectric material comprises $x[Bi(Mg_{0.5}Ti_{0.5})O_3]$-$(1-x)[Pb(Zr_yTi_{1-y})O_3]$ with x and y concentrations of $30\%<x<40\%$ and $0<y<40\%$.

15. The method of claim 14, wherein the ferroelectric material includes Indium (In).

16. The method of claim 14, wherein the ferroelectric material includes Ytterbium (Yb).

17. The method of claim 14, wherein x=0.35 and y=0.

* * * * *